United States Patent
Kawai et al.

[11] Patent Number: 6,022,774
[45] Date of Patent: Feb. 8, 2000

[54] METHOD FOR PRODUCTION OF SEMICONDUCTOR DEVICE

[75] Inventors: Shinichi Kawai; Tatsuya Yamazaki; Hisashi Miyazawa, all of Kanagawa, Japan; Keng Tan, Taipei, Taiwan; Kenichi Goto, Kanagawa, Japan

[73] Assignee: Fujitsu Limited, Kawasaki, Japan

[21] Appl. No.: 09/014,245

[22] Filed: Jan. 27, 1998

[30] Foreign Application Priority Data

Mar. 19, 1997 [JP] Japan ................................ 9-067077

[51] Int. Cl.⁷ .................................................. H01L 21/8242
[52] U.S. Cl. ............................... 438/240; 438/3; 438/655
[58] Field of Search ............................. 438/3, 240, 241, 438/253, 396, 655, 656

[56] References Cited

U.S. PATENT DOCUMENTS

| | | | |
|---|---|---|---|
| 5,352,623 | 10/1994 | Kamiyama | 438/240 |
| 5,554,559 | 9/1996 | Wolters et al. | 438/3 |
| 5,750,419 | 5/1998 | Zafar | 438/240 |

*Primary Examiner*—Chandra Chaudhari
*Attorney, Agent, or Firm*—Armstrong, Westerman, Hattori, McLeland & Naughton

[57] ABSTRACT

A semiconductor device is produced by a method which comprises forming a conductor pattern in or on a semiconductor layer, covering the surface of the conductor pattern with an antioxidant conductor layer, forming a first insulating layer on the semiconductor layer, forming a lower electrode of a capacitor on the first insulating layer, forming a dielectric layer of an oxygen-containing material on the lower electrode, forming an upper electrode on the dielectric layer, sequentially patterning the upper electrode, the dielectric layer, and the lower electrode in the shape of a capacitor, forming a second insulating layer covering the semiconductor layer, the antioxidant conductor layer, and the capacitor, patterning the second insulating layer thereby simultaneously forming a first opening and a second opening on the upper electrode and the conductor pattern, heating the interiors of the first opening and the second opening and the upper electrode in an oxygen-containing atmosphere, forming a conductor layer overlying the second insulating layer and filling the interiors of the first and second openings, and patterning the conductor layer thereby forming a first wiring connected to the upper electrode through the first opening and a second wiring electrically continuing to the conductor pattern through the second opening.

12 Claims, 5 Drawing Sheets

METHOD FOR PRODUCTION OF SEMICONDUCTOR DEVICE

BACKGROUND OF THE INVENTION

1. Field of the Invention

This invention relates to a method for the production of a semiconductor device and more particularly to a method for the production of a semiconductor device which is possessed of a ferroelectric capacitor.

2. Description of the Prior Art

FRAM (ferroelectric random access memory) is known as an non-volatile semiconductor memory device and it comprises a plurality of memory cells each composed of a capacitor provided with a ferroelectric layer and a n type MOS transistor. A lead titanate zirconate [$Pb(Zr_xTi_{1-x})O_3$] film is one example of the ferroelectric layer.

Now a standard process for the formation of one of the memory cells of the FRAM will be described below. The lead titanate zirconate will be hereinafter referred to as PZT.

First, an isolated n type MOS transistor 2 is formed on a silicon substrate 1 as illustrated in FIG. 1A.

This n type MOS transistor 2 is formed in a region enclosed with a field oxide 6 on the surface of the silicon substrate 1 and is composed of a gate electrode 4 formed on the silicon substrate 1 through the medium of a gate insulating layer 3 and a source region 5s and a drain region 5d formed in the silicon substrate 1 beside the gate electrode 4. The source region 5s and the drain region 5d are formed by ion implantation such an n type impurity as phosphorus or arsenic into the silicon substrate with the gate electrode 4 as a mask and then annealing the silicon substrate 1 for activation.

This gate electrode 4 constitutes itself part of a word line WL. This part of the word line WL is so formed as to pass on the field oxide 6.

After the n type MOS transistor 2 and the word line WL have been formed as described above, an interlayer insulating layer 7 for covering the n type MOS transistor 2 and the word line WL is formed as illustrated in FIG. 1B. BPSG (boro-phospho siilicate glass) grown by the CVD is used, for example, for the interlayer insulating layer 7.

Next, the process needed to produce the state illustrated in FIG. 1C will be described.

When a first platinum (Pt) layer 8 and a PZT layer 9 are sequentially grown in the order mentioned on the interlayer insulating layer 7 which overlies the field oxide 6 adjoining the n type MOS transistor 2, the resultant superposed layers are annealed in an atmosphere of oxygen to crystallize the PZT layer 9. A second Pt layer 10 is subsequently formed on the PZT layer 9.

Thereafter, the second Pt layer 10 is patterned by the dry etching method using an etching gas and a resist mask. The patterned second Pt layer 10 is used as the upper electrode of a capacitor. Since this etching deteriorates the quality of the PZT layer 9, the superposed layers existent at this point is annealed in an atmosphere of oxygen to supply oxygen through the second Pt layer 10 to the PZT layer 9.

The PZT layer 9 is further patterned in the shape of a dielectric layer of the capacitor by the dry etching method using a resist mask. The first Pt layer 8 is subsequently patterned in the shape of a lower electrode of the capacitor by the dry etching method using a resist mask. In each of these etching operations, the superposed layers are annealed in an atmosphere of oxygen to supply oxygen through the second Pt layer 10 to the PZT layer 9.

The patterning of the capacitor is thus completed.

Then, a protective insulating layer 11 of $SiO_2$ is wholly grown by the method of vapor-phase growth using tetra ethoxy silane (TEOS). Subsequently, the protective insulating layer 11 is patterned to form a first and a second opening 11a, 11b as illustrated in FIG. 1D so as to expose the second Pt layer 10 (upper electrode) through the first opening 11a and, at the same time, expose the lower electrode through the second opening 11b.

Thereafter, for the recovery of PZT layer quality, the resultant superposed layers are annealed in an atmosphere of oxygen to supply oxygen through the second Pt layer 10 to the PZT layer 9.

Further, the protective insulating layer 11 and the interlayer insulating layer 7 are patterned to form a third opening 11g for exposing the gate electrode 4 (word line WL), a fourth opening lid for exposing the drain region 5d, and a fifth opening 11s for exposing the source region 5s as illustrated in FIG. 1E.

Subsequently, an aluminum layer is formed throughout the entire surface and this aluminum layer is patterned by the method of photolithography to form wirings 12a, 12b, 12s, 12d, and 12g as illustrated in FIG. 1F.

The steps described above result in forming the memory cell of the FRAM.

In these steps, after the PZT layer 9 is annealed for the sake of crystallization, the component layers are annealed four times in the atmosphere of oxygen for the purpose of supplying oxygen to the PZT layer 9. The reason for the necessity of the repeated annealing is that the PZT layer will suffer the ferroelectricity thereof to be impaired when it is degraded by the hydrogen in the etching gas and consequently depleted of oxygen. Incidentally, the Pt layer permits relatively easy passage of hydrogen and oxygen when it has a thickness of the order of several hundreds of nm.

In the process described above, the formation of the first and second openings 11a and 11b and the formation of the third through fifth openings 11g, 11s, and 11d, both intended for preventing the source region 5s and the drain region 5d of the n type MOS transistor from being oxidized during the annealing operation in the atmosphere of oxygen, are carried out at separate steps.

When the openings to be formed in the same insulating layer are produced at two steps, since the positions for the formation of the first and second openings and those for the formation of the third through fifth openings are liable to deviate relative to one another, the alignment of wirings in these openings will become difficult and the yield will be possibly degraded.

SUMMARY OF THE INVENTION

An object of this invention is to provide a method for the production of a semiconductor device which allows a decrease in the number of steps in the formation of openings and wirings and permits an improvement in the yield.

According to this invention, a capacitor is formed above a semiconductor layer after a conductive pattern formed in an upper part of the semiconductor layer or above the semiconductor layer has been covered with an antioxidant conductor layer, and an insulating layer is formed on the conductor pattern and the capacitor. Thereafter openings on the conductor pattern and the capaciator are formed in the insulating layer.

When the openings are simultaneously formed on the conductor pattern and on the capacitor at the step for forming openings in the insulating layers on the conductor pattern and the capacitor, therefore, the possibility of the conductor pattern being oxidized is nil, and the possibility that the conductor pattern will be oxidized through one opening when the capacitor is heat-treated through the other opening in an atmosphere of oxygen is eliminated. As a result, the relative positional deviation between the openings on the conductor pattern and the openings on the capacitor will no longer occur and the alignment of these openings with the wirings will be facilitated.

A silicide is used for the conductor pattern. Among other suicides, cobalt silicide particularly excels in the resistance to oxidation.

When an impurity-diffused semiconductor layer is used for the conductor pattern, the silicide layer acquires an increase in contact resistance when it is heated in an atmosphere of oxygen at a temperature exceeding 900° C. It has been confirmed experimentally that the restoration of the ferroelectric layer of the capacitor from the damage inflicted thereon in consequence of the formation of openings in the insulating layer requires the heat treatment to be performed in the atmosphere of oxygen at a temperature of not lower than 450° C.

The data indicates that the heat treatment performed in the atmosphere of oxygen for the restoration of the ferroelectric layer from the damage is preferred to proceed at a temperature not lower than 450° C. and not higher than 900° C. When a silicide layer is adopted for the antioxidant layer, it is appropriate to adopt the salicide (self-align silicide) process for the purpose of curtailing the process of production and progressing the device scaling down.

DESCRIPTION OF THE PREFERRED EMBODIMENTS

Figure 1A:
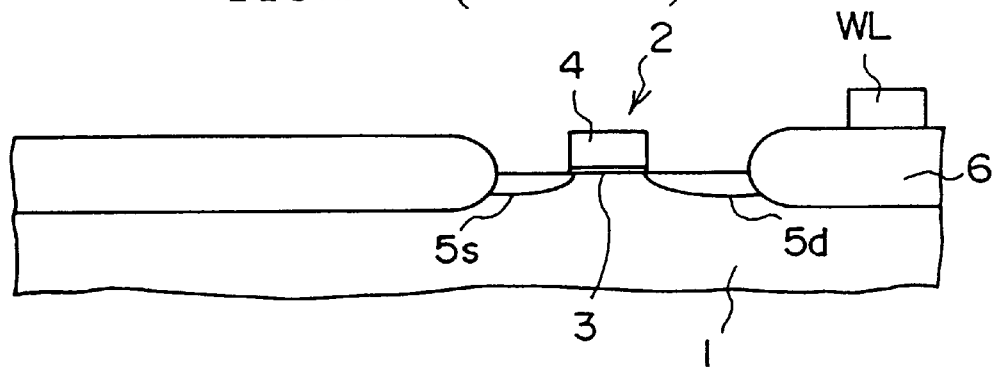
FIG. 1A–FIG. 1F are cross sections illustrating a process for the production of a conventional semiconductor device.
Figure 1B:
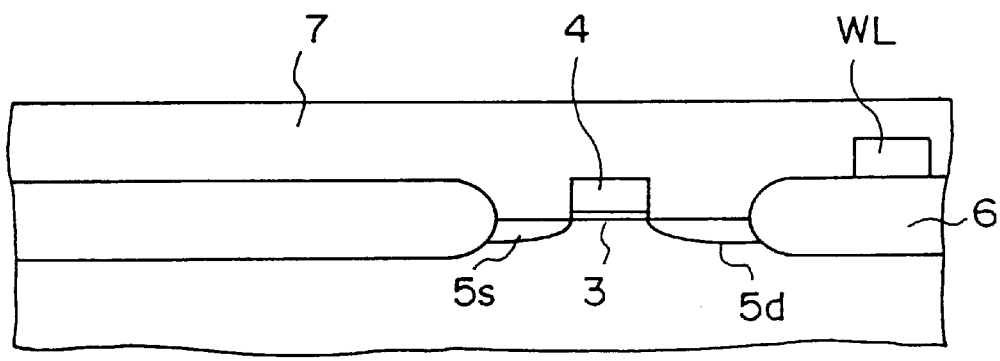
Figure 1C:
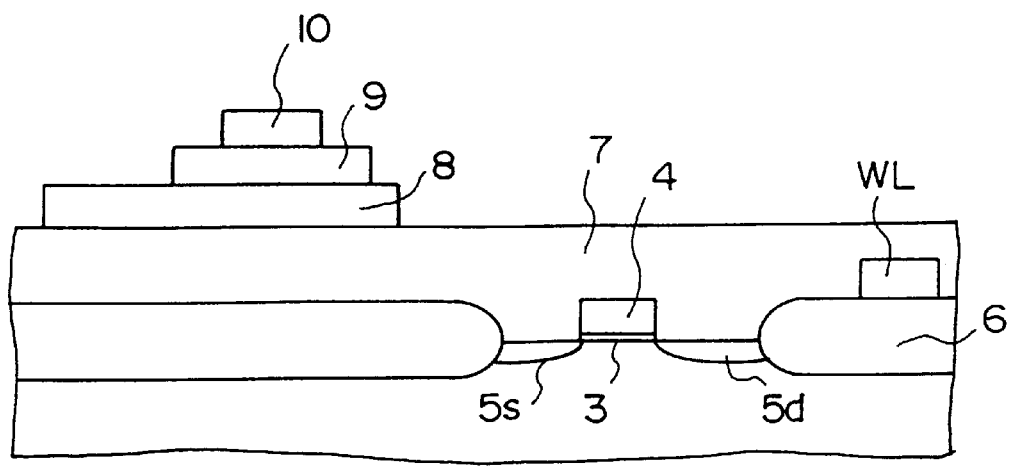
Figure 1D:
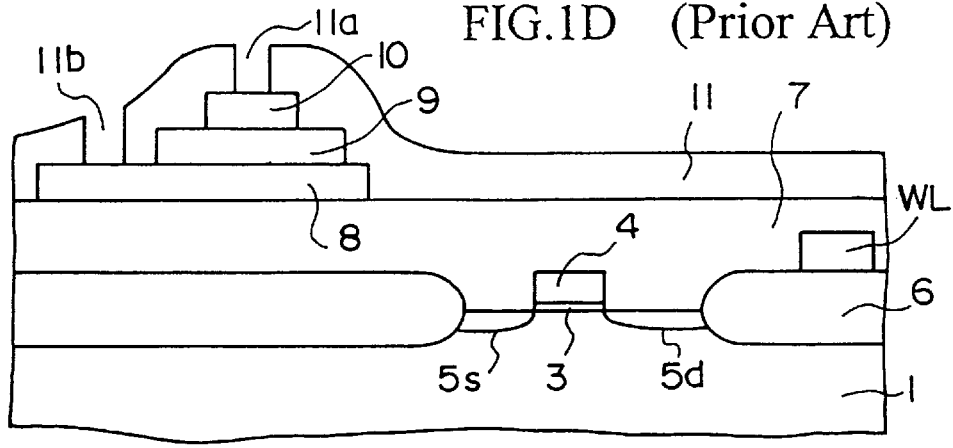
Figure 1E:
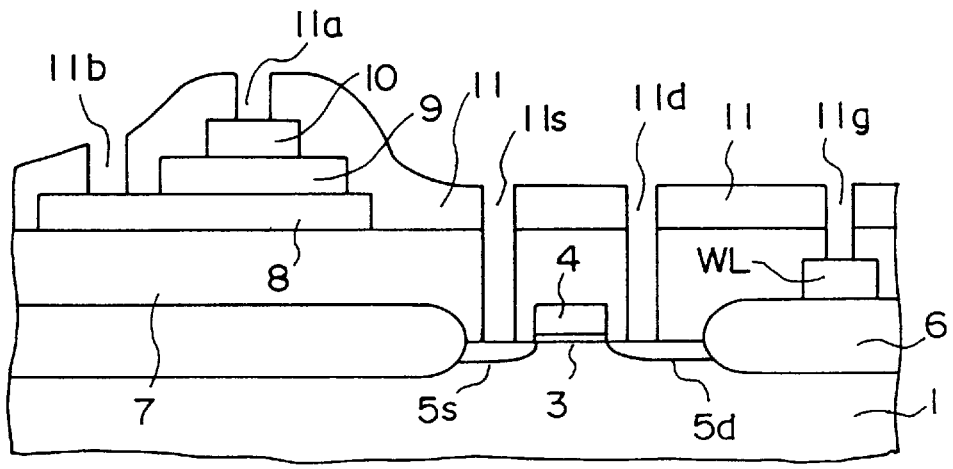
Figure 1F:
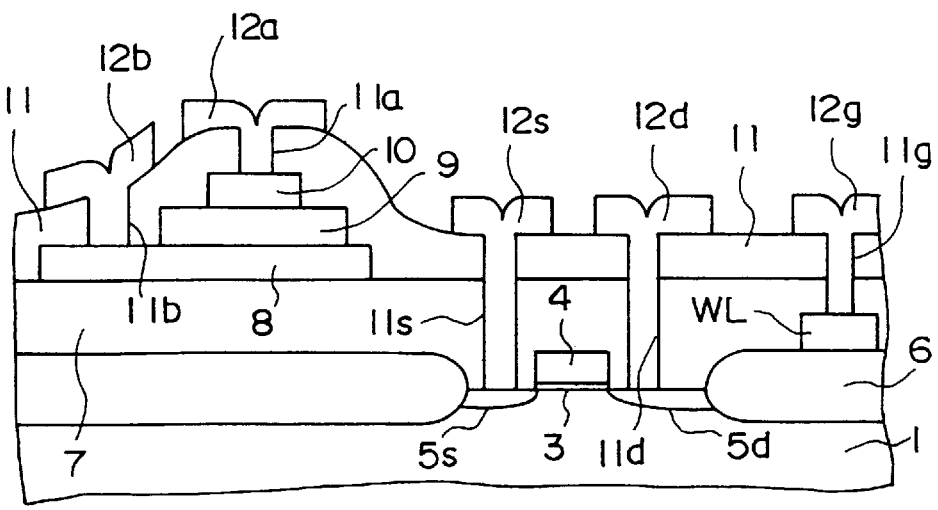

Now preferred embodiments of this invention will be described below with reference to the annexed drawings.

FIG. 2A–FIG. 2H are cross sections illustrating a process for the production of a memory cell of the FRAM according to one preferred embodiment of this invention.

First, the step up to the formation of an n type MOS transistor illustrated in FIG. 2A will be described. Into a region for forming a p well in a p type silicon substrate 21, 10 Ω.cm in resistivity, boron is ion implanted under the conditions of 180 keV of accelerated energy and $1.5 \times 10^{13}$ atoms/cm$^2$ of dosage. The silicon substrate 21 is subsequently left standing in an atmosphere of nitrogen at 1150° C. for 300 minutes to permit diffusion of impurities. As a result, the p well is formed in the siilicon substrate 21.

Next an field oxide layer 22 is formed by the local oxidation method in a thickness of 500 nm on the (100) plane of the silicon substrate 21. This field oxide layer 22 is formed in a steam-containing atmosphere at 900° C., with the active region of the silicon substrate covered with a mask of silicon nitride.

After the silicon nitride mask has been separated, impurities are implanted in a prescribed amount into the channel region in the active region for the purpose of adjusting the threshold voltage of the n type MOS transistor to be formed in the active region. Boron, for example, is used for the impurity.

The obverse side of the silicon substrate 21 is subsequently oxidized by the argon partial pressure oxidation method at a temperature of 1050° C. to form a gate oxide layer 23 of SiO$_2$ in a thickness of 12 nm in the active region.

Next, a polycrystalline silicon layer is grown by the CVD method to a thickness of 200 nm and phosphorus ions are implanted into the polycrystalline silicon layer under the conditions of 20 keV of accelerated energy and $4 \times 10^{15}$ atoms/cm$^2$ of dosage.

The polycrystalline silicon layer is patterned by the method of photolithography to form a ribbonlike word line WL. This word line WL is destined to form a gate electrode 24 in the active region.

Arsenic ions are subsequently implanted into the silicon substrate 21, with the gate electrode 24 and the field oxide layer 22 each as a mask, under the conditions of 50 keV of accelerated energy and $4 \times 10^{13}$ atoms/cm$^2$ of dosage to form a shallow impurity-incorporating layer.

Then, an SiO$_2$ layer, 150 nm in overall layer thickness, grown by the CVD method and this SiO$_2$ layer is etched until parts of the SiO$_2$ layer remain exclusively on the lateral walls of the gate electrode 24. These parts of the SiO$_2$ layer which remain on the lateral walls of the gate electrode 24 will be referred to hereinafter as side walls 25.

Arsenic ions are then implanted into the silicon substrate 31, with the gate electrode 24, the side walls 25, and the field oxide 22 each as a mask, under the conditions of 70 keV of accelerated energy and $5 \times 10^{15}$ atoms/cm$^2$ of dosage to form deep impurity-implanted layers on both the outer sides of the gate electrode 24 and the side walls 25.

Thereafter, the silicon substrate 21 is heated in an atmosphere of nitrogen at a temperature of 850° C. for 40 minutes to activate the shallow impurity-implanted layer and the deep impurity-implanted layer and form impurity-diffused layers 26s and 26d of the LDD structure. The impurity-diffused layer 26s on one side of the gate electrode 24 is destined to constitute a source region and the impurity-diffused layer 26d on the other side thereof a drain region.

Figure 2A:
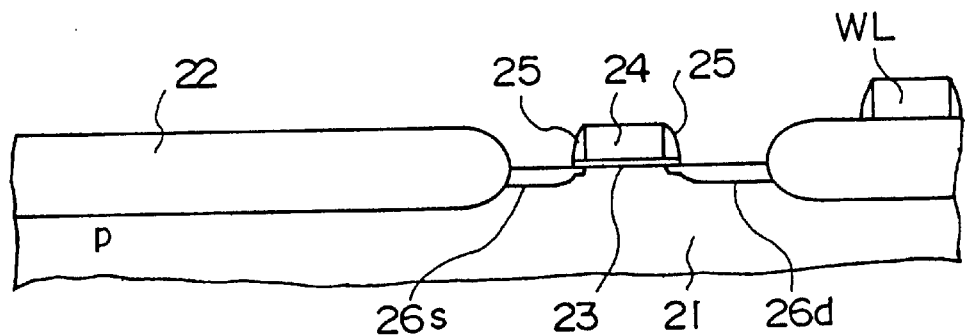
FIG. 2A–FIG. 2H are cross sections illustrating a process for the production of a semiconductor device as one embodiment of this invention.

By the steps described above, the basic structure of the n type MOS transistor illustrated in FIG. 2A is formed.

Figure 2B:
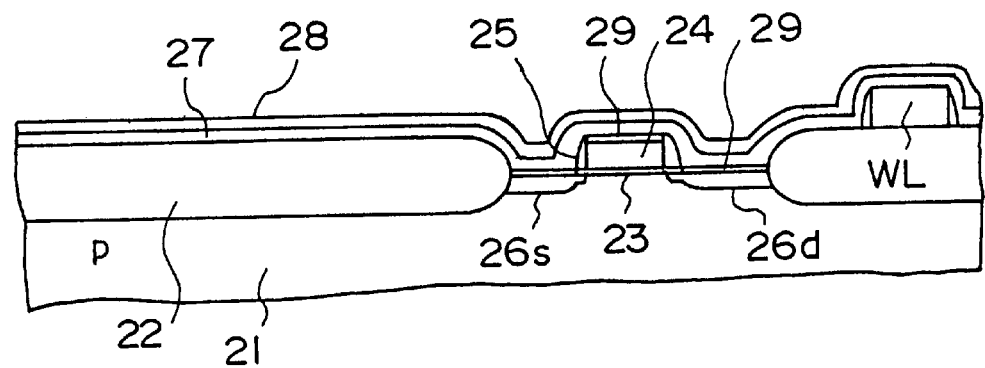

Next, the oxide layers on the surfaces of the impurity-diffused layers 26s and 26d which are not covered with the gate electrode 24 and the side walls 25 are moved with hydrofluoric acid. Thereafter, a Co layer 27 of a thickness of 10 nm and a TiN layer 28 of a thickness of 30 nm are formed by the sputtering method as illustrated in FIG. 2B and these layers 27 and 28, the gate electrode 24, and the silicon substrate 21 are subjected to an RTA (rapid thermal annealing) treatment performed at a temperature of 500° C. for 30 seconds to form a cobalt silicide layer 29 on the impurity-diffused layers 26s and 26d and on the gate electrode 24 as well.

Thereafter, the TiN layer 28 and the unaltered Co layer 27 are removed and the silicon substrate 21 is subjected to an RTA treatment under the conditions of 750° C. and 30 seconds.

Figure 2C:
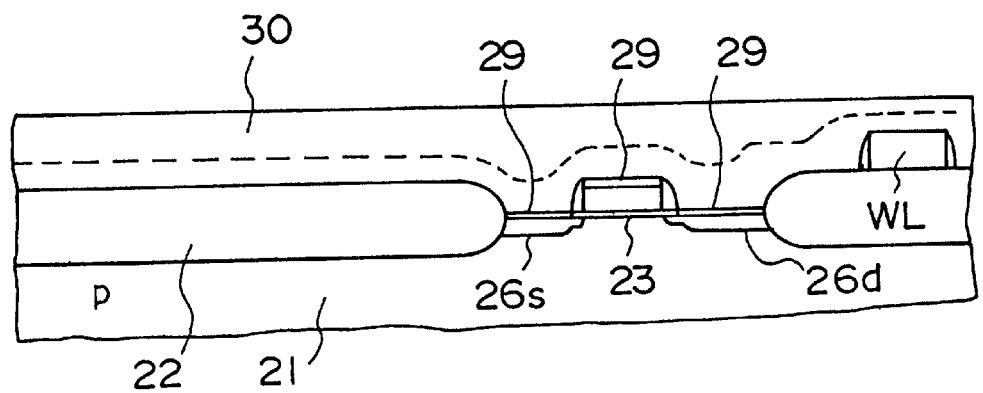

Further, SiO$_2$ and BPSG are sequentially grown by the CVD method in respective thicknesses of 50 nm and 350 nm to give rise to an interlayer insulating layer 30 as illustrated in FIG. 2C. Thereafter, the silicon substrate 21 and the component layers superposed thereon are annealed at a temperature of 850° C. for 30 seconds in RTA (rapid thermal annealing).

Figure 2D:
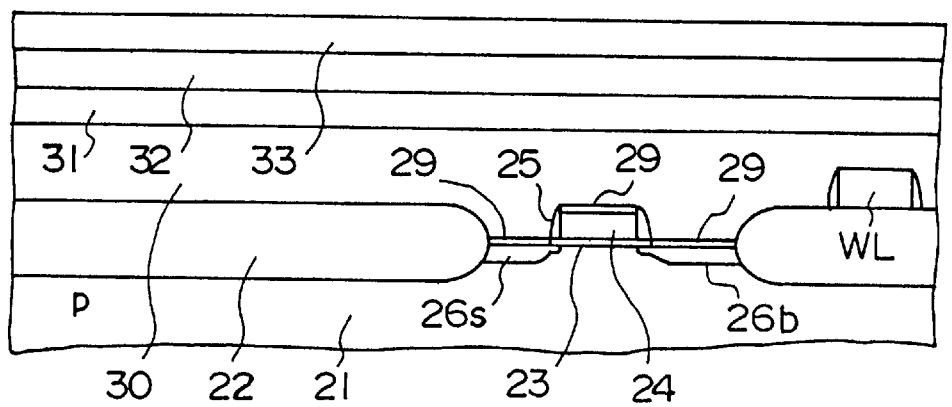

Next, a Ti layer and a Pt layer are sequentially formed by the sputtering method in respective thicknesses of 20 nm and 150 nm to give rise to a lower electrode 31 on the interlayer insulating layer 30 superposed on the field oxide 22 and then a PZT ferroelectric layer 32 is formed by the sputtering method in a thickness of 240 nm as illustrated in FIG. 2D.

Thereafter, the PZT ferroelectric layer 32 is subjected to an RTA treatment in an atmosphere of oxygen under the conditions of 850° C. and 5 seconds for crystallizing the PZT ferroelectrlc layer 32.

Subsequently, a Pt layer as an upper electrode 33 is formed in a thickness of 150 nm on the PZT ferroelectric layer 32 by the sputtering method.

Figure 2E:
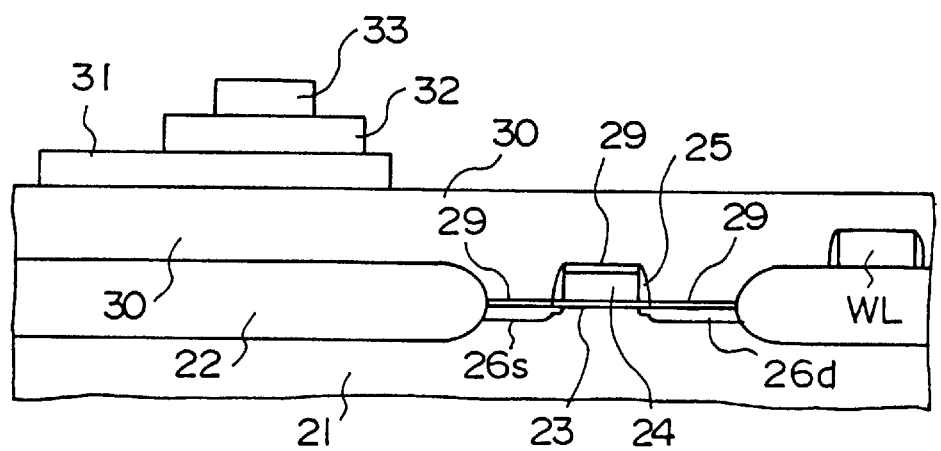

Next, the upper electrode 33, the PZT ferroelectric layer 32, and the lower electrode 31 are patterned as illustrated in FIG. 2E.

Specifically, a resist pattern is formed on the upper electrode 33 and the upper electrode 33 is patterned in a prescribed shape by the plasma etching method using $Cl_2$ as an etchant.

The PZT ferroelectric layer 32 tends to be degraded by the hydrogen contained in the reaction gas during the course of this patterning operation. After the patterning operation, therefore, the PZT ferroelectric layer 32 is annealed in an atmosphere of oxygen under the conditions of 650° C. and 60 minutes to recover the quality of the PZT ferroelectric layer 32. Incidentally, hydrogen and oxygen tend to pass the upper electrode 33 which is formed of Pt.

The PZT ferroelectric layer 32 is further patterned by using other resist pattern and etchant and the lower electrode 31 is patterned by using yet other resist pattern and etchant.

After each of these two rounds of patterning, the PZT layer is annealed in an atmosphere of oxygen under the conditions of 550° C. and 60 minutes to recover the quality of the PZT ferroelectric layer 32.

By the treatments described above, the basic patterning is completed on the upper electrode 31, the PZT ferroelectric layer 32, and the lower electrode 33 which jointly form the capacitor.

Figure 2F:
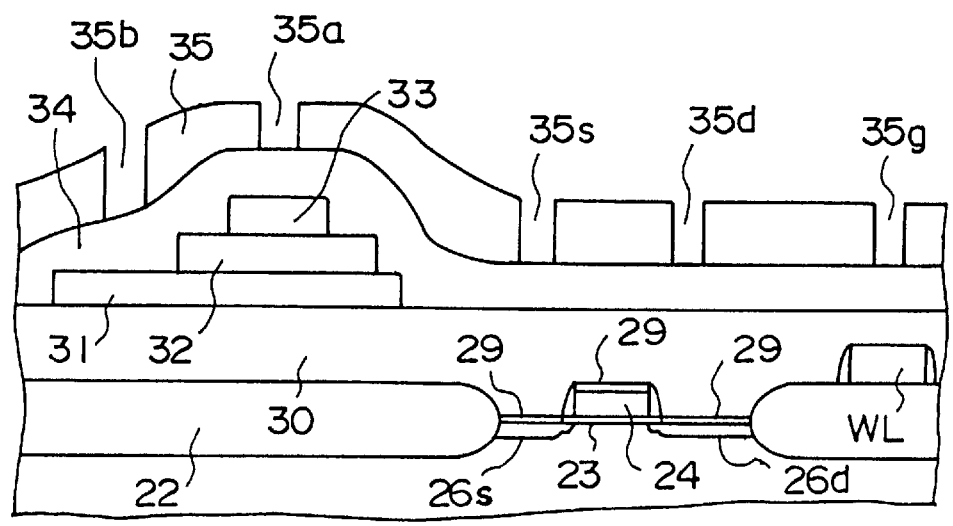

Next, by the vapor phase growth method using TEOS an $SiO_2$ protective insulating layer 34 is grown in a thickness of 400 nm as illustrated in FIG. 2F. Thus, the $SiO_2$ protective insulating 34 covers the capacitor and the n type MOS transistor.

Further, the $SiO_2$ protective insulating layer 34 and the interlayer insulating layer 30 are etched by using a resist pattern 35 provided with a window 35a on the upper electrode 33, the lower electrode 32, the impurity-diffused layers 26s and 26d, and the gate electrode 24 (word line WL). As a result, a first opening 36a is formed on the upper electrode 33, a second opening 36b on the lower electrode 32, a third and a fourth opening 36s and 36d on the two impurity-diffused layers 26s and 26d, and a fifth opening 36g on the gate electrode 24 (word line WL) at the same time. In this case, the cobalt silicide layer 29 is exposed through the third through fifth openings 36s, 36d, and 36g.

A fluorine type gas is used as the etching gas for the $SiO_2$ protective insulating layer 34 and the interlayer insulating layer 30 and a plasma etcher is used as the etching equipment.

Figure 2G:
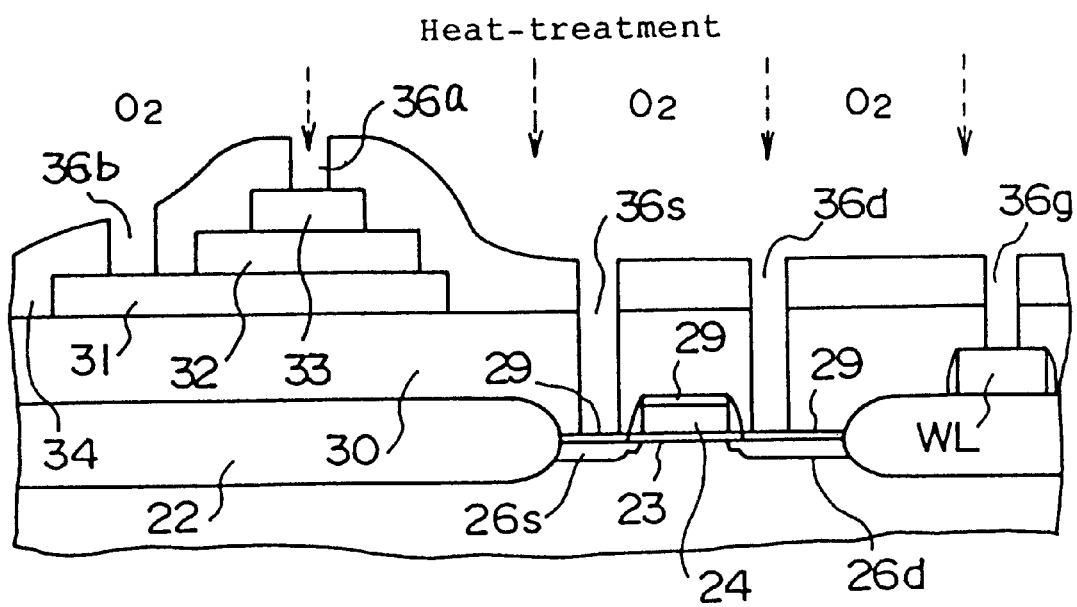

In the course of this etching operation, the formation of the first opening 36a inflicts damage on the PZT ferroelectric layer 32. For the restoration of the PZT ferroelectric layer 32 from the damage, therefore, the PZT ferroelectric layer 32 is heated in an atmosphere of oxygen under the conditions of 550° C. and 60 minutes as illustrated in FIG. 2G so as to recover the quality of this layer.

Figure 2H:
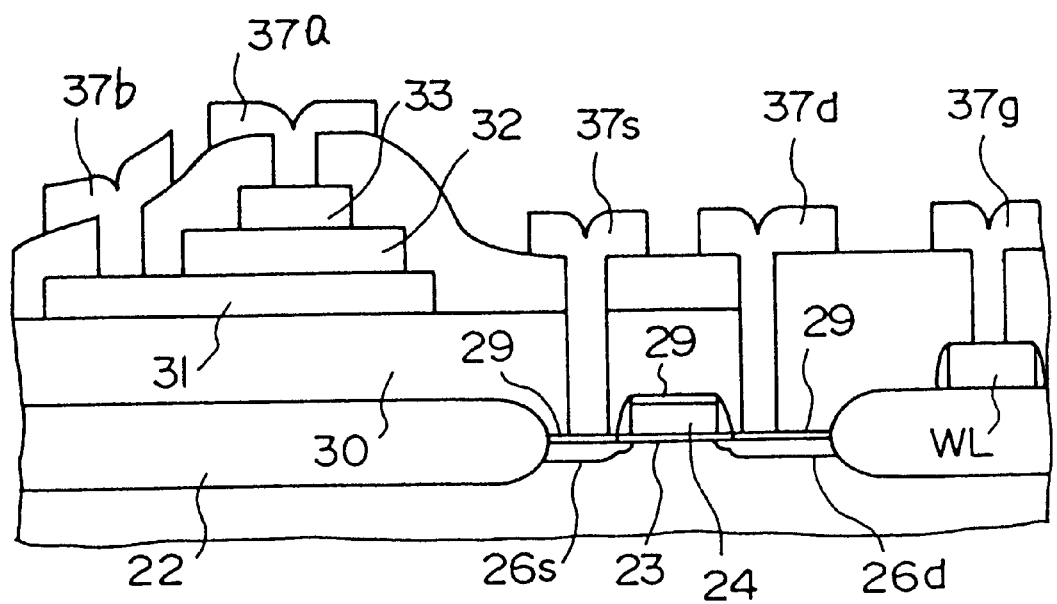

Thereafter, a Ti layer, a TiN layer, and an Al layer are sequentially formed in respective thicknesses of 20 nm, 50 nm, and 600 nm on the $SiO_2$ protective insulating layer 34 and inside the first through fifth openings 36a, 36b, 36s, 36d, and 36g. These Ti layer, Tin layer, and Al layer are patterned by the standard method of photolithography. As a result, a first wiring 37a connected to the upper electrode 33 of the capacitor is formed through the first opening 36a, a second wiring 37b connected to the lower electrode 31 of the capacitor through the second opening 36b, a third wiring layer 37s connected to the cobalt silicide layer 29 on the impurity-diffused layer 26s through the third opening 36s, a fourth wiring layer 37d connected to the cobalt silicide layer 29 on the impurity-diffused layer 26d through the fourth opening 36d, and a fifth wiring layer 37g connected to the cobalt silicide layer 29 on the gate electrode 24 (word line WL) through the fifth opening 36g respectively as illustrated in FIG. 2H.

Since the cobalt silicide layer 29 is formed on the gate electrode 24 and the impurity-diffused layers 26s and 26d jointly in the process described above, the possibility that the surfaces of the gate electrode and the impurity-diffused layers 26s and 26d will be oxidized is precluded even when the first through fifth openings 36a, 36b, 36g, 36s, and 36d are formed at the same step and then the upper electrode 33 and the ferroelectric layer 32 are heated in an atmosphere of oxygen. As a result, the relative positional deviation among the first through fifth openings 36a, 36b, 36s, 36d, and 36g will no longer occur, the alignment of the wirings and the openings formed on the protective insulating layer 34 will be facilitated, and the yield will be improved.

Though other high melting metallic silicide may be used for the antioxidant layer on the gate electrode 24 and the impurity-diffused layers 26s and 26d, cobalt silicide which offers excellent resistance to oxidation and perfectly matches the semiconductor process is favorably used.

In the experiment conducted by the present inventors, the layer of cobalt silicide superposed on the surface of the silicon substrate showed no discernible rise of contact resistance when heated to temperatures exceeding 900° C. in an atmosphere of oxygen. In contrast, the layer of cobalt silicide formed on polycrystalline silicon showed a rise of resistance when heated to temperatures exceeding 900° C. in an atmosphere of oxygen, indicating that the layer is not perfectly safe for practical use.

It has been ascertained that when the PZT ferroelectric layer is damaged by the formation of openings on the upper electrode and the lower electrode of the capacitor, it can be restored from the damage by being heated to temperatures exceeding 450° C. in an atmosphere of oxygen.

The results of the experiment indicate that for the purpose of restraining the rise of contact resistance between the gate electrode 24 and the impurity-diffused layers 26s and 26d on the one hand and the wirings mentioned above on the other hand and, at the same time, restoring the ferroelectric layer from the damage, the ferroelectric layer 32 is preferred to be heated to temperatures exceeding 450° C. and not exceeding 900° C. in an atmosphere of oxygen.

The preceding embodiment has been depicted as using PZT for the ferroelectric layer of the capacitor. When such an oxide dielectric material as strontium.bismuth. tantalum (SBT) is used as a ferroelectric substance, it has the possibility of suffering escape of oxygen and consequently losing dielectric constant. When the material of this nature is adopted, the formation of openings in the insulating film covering the MOS transistor and the capacitor can be fulfilled by one step by preparatorily covering the layers superposed on the impurity-diffused layers and the gate electrode with a refractory metallic silicide, particularly cobalt silicide. The refractory metallic silicide is preferred to adopt the salicide technique mentioned above because this technique permits a cut in the process.

According to this invention, since the capacitor is formed after the semiconductor layer or the conductor pattern superposed on the semiconductor layer has been covered with an antioxidant layer and the insulating layer is further formed on the conductor pattern and the capacitor as described above, the possibility that the conductor pattern will be oxidized while the capacitor is being heat-treated in an atmosphere of oxygen through the openings is precluded even when the openings are formed in the insulating layer on the conductor pattern and the capacitor.

As a result, the possibility that the conductor pattern will be oxidized when the openings are simultaneously formed on the conductor pattern and the capacitor is eliminated. Consequently, the relative positional deviation between the openings on the conductor pattern and the openings on the capacitor can be precluded and the alignment of the openings with the wiring is facilitated.

What is claimed is:

1. A method for fabricating a semiconductor device comprising the steps of:

forming a conductor pattern in an upper part of a semiconductor layer or above said semiconductor layer;

forming an oxidation resisting conductor layer covering the surface of said conductor pattern;

forming a first insulating layer on said semiconductor layer and said antioxidant conductor layer;

forming a first conductor layer on said insulating layer;

forming a dielectric layer of an oxygen-containing material on said first conductor layer;

forming a second conductor layer on said dielectric layer;

sequentially patterning said second conductor layer, said dielectric layer, and said first conductor layer thereby forming an upper electrode, a dielectric, and a lower electrode of a capacitor;

forming a second insulating layer on said semiconductor layer, said antioxidant conductor layer, said first insulating layer, and said capacitor;

patterning said second insulating layer thereby simultaneously forming a first opening and a second opening on said upper electrode of said capacitor and said conductor pattern respectively;

heating the interiors of said first opening, said second opening, and said upper electrode in an oxygen-containing atmosphere;

forming a third conductor layer overlying said second insulating layer and filling the interiors of said first and second openings; and patterning said third conductor layer thereby forming a first wiring layer connecting to said upper electrode through said first opening and a second wiring layer connecting to said conductor pattern through said second opening.

2. A method for fabricating a semiconductor device according to claim 1, wherein said dielectric layer is a PZT layer.

3. A method for fabricating a semiconductor device according to claim 2, wherein said PZT layer is formed by sputtering.

4. A method for fabricating a semiconductor device according to claim 1, wherein said conductor pattern is a gate electrode of an MOS transistor.

5. A method for fabricating a semiconductor device according to claim 1, wherein said conductor pattern is formed of an impurity-diffused semiconductor layer.

6. A method for fabricating a semiconductor device according to claim 1, wherein said heating step is carried out at a temperature range from 450° C. to 900° C.

7. A method for fabricating a semiconductor device according to claim 1, wherein said oxidation resisting conductor layer is a silicide layer.

8. A method for fabricating a semiconductor device according to claim 7, wherein said silicide layer is a cobalt silicide layer.

9. A method for fabricating a semiconductor device according to claim 7, wherein said silicide layer forming by the salicide process.

10. A method for fabricating a semiconductor device according to claim 1, wherein said first insulating layer contains a silicon oxide formed by chemical vapor deposition.

11. A method for fabricating a semiconductor device according to claim 1, wherein said second conductor layer is a platinum layer.

12. A method for fabricating a semiconductor device according to claim 1, wherein said second insulating layer is a silicon dioxide layer formed by chemical vapor deposition using TEOS.

* * * * *